United States Patent
Cook et al.

(10) Patent No.: US 7,875,125 B2
(45) Date of Patent: Jan. 25, 2011

(54) METHOD FOR EXTENDING EQUIPMENT UPTIME IN ION IMPLANTATION

(75) Inventors: Kevin S. Cook, Hammonds Plains (CA); Dennis Manning, Commerce, OK (US); Edward K. McIntyre, Franklin, MA (US); Richard Goldberg, Boston, MA (US)

(73) Assignee: SemEquip, Inc., North Billerica, MA (US)

( * ) Notice: Subject to any disclaimer, the term of this patent is extended or adjusted under 35 U.S.C. 154(b) by 222 days.

(21) Appl. No.: 12/234,202

(22) Filed: Sep. 19, 2008

(65) Prior Publication Data

US 2009/0081874 A1 Mar. 26, 2009

Related U.S. Application Data

(60) Provisional application No. 60/974,176, filed on Sep. 21, 2007.

(51) Int. Cl.
*B08B 5/00* (2006.01)
(52) U.S. Cl. .................. 134/31; 134/22.18; 134/42; 134/22.1; 134/1.1; 134/39; 438/706
(58) Field of Classification Search ............ 134/31, 134/22.18, 42, 22.1, 1.1, 39; 438/706; 257/E21.214
See application file for complete search history.

(56) References Cited

U.S. PATENT DOCUMENTS

| | | | |
|---|---|---|---|
| 4,105,916 A | 8/1978 | Siegel | |
| 4,254,340 A | 3/1981 | Camplan et al. | |
| 4,409,486 A | 10/1983 | Bates | |
| 4,412,900 A | 11/1983 | Tanaka et al. | |
| 4,512,812 A | 4/1985 | Liebert et al. | |
| 4,529,474 A | 7/1985 | Fujiyama et al. | |
| 4,619,844 A | 10/1986 | Pierce et al. | |
| 4,640,221 A | 2/1987 | Barbee et al. | |
| 4,657,616 A | 4/1987 | Benzing et al. | |
| 4,665,315 A | 5/1987 | Bacchetti et al. | |
| 4,703,183 A | 10/1987 | Guerra | |
| 4,723,967 A | 2/1988 | Tom | |

(Continued)

FOREIGN PATENT DOCUMENTS

EP 0140975 5/1985

(Continued)

OTHER PUBLICATIONS

EPO Search Report EP 04 81 3789, Jan. 10, 2007.

(Continued)

*Primary Examiner*—Michael Barr
*Assistant Examiner*—Katelyn B Whatley
(74) *Attorney, Agent, or Firm*—John S. Paniaguas; Katten Muchin Rosenman LLP

(57) ABSTRACT

The invention features in-situ cleaning process for an ion source and associated extraction electrodes and similar components of the ion-beam producing system, which chemically removes carbon deposits, increasing service lifetime and performance, without the need to disassemble the system. In particular, an aspect of the invention is directed to an activating, catalytic, or reaction promoting species added to the reactive species to effectively convert the non-volatile molecular residue into a volatile species which can be removed by conventional means.

6 Claims, 1 Drawing Sheet

U.S. PATENT DOCUMENTS

| | | |
|---|---|---|
| 4,738,693 A | 4/1988 | Tom |
| 4,786,352 A | 11/1988 | Benzing |
| 4,958,078 A | 9/1990 | Becchetti |
| 4,960,488 A | 10/1990 | Law et al. |
| 4,983,850 A | 1/1991 | Tsukakoshi et al. |
| 5,028,791 A | 7/1991 | Koshiishi et al. |
| 5,049,784 A | 9/1991 | Matsudo |
| 5,083,061 A | 1/1992 | Koshiishi et al. |
| 5,089,747 A | 2/1992 | Koshiishi et al. |
| 5,097,179 A | 3/1992 | Takayama |
| 5,101,110 A | 3/1992 | Matsudo et al. |
| 5,129,958 A | 7/1992 | Nagashima et al. |
| 5,132,545 A | 7/1992 | Shono et al. |
| 5,144,147 A | 9/1992 | Shiozaki et al. |
| 5,158,644 A | 10/1992 | Cheung et al. |
| 5,186,120 A | 2/1993 | Ohnishi et al. |
| 5,206,516 A | 4/1993 | Keller et al. |
| 5,262,652 A | 11/1993 | Bright et al. |
| 5,279,129 A | 1/1994 | Ito |
| 5,281,302 A | 1/1994 | Gabric et al. |
| 5,294,797 A | 3/1994 | Frey et al. |
| 5,296,713 A | 3/1994 | Tanaka |
| 5,306,921 A | 4/1994 | Tanaka et al. |
| 5,312,519 A | 5/1994 | Sakai et al. |
| 5,350,926 A | 9/1994 | White et al. |
| 5,354,698 A | 10/1994 | Cathey, Jr. |
| 5,362,328 A | 11/1994 | Gardiner et al. |
| 5,369,279 A | 11/1994 | Martin |
| 5,429,070 A | 7/1995 | Campbell et al. |
| 5,451,258 A | 9/1995 | Hillman et al. |
| 5,466,942 A | 11/1995 | Sakai et al. |
| 5,486,235 A | 1/1996 | Ye et al. |
| 5,489,550 A | 2/1996 | Moslehi |
| 5,497,006 A | 3/1996 | Sferlazzo et al. |
| 5,536,330 A | 7/1996 | Chen et al. |
| 5,554,854 A | 9/1996 | Blake |
| 5,576,538 A | 11/1996 | Sakai et al. |
| 5,616,208 A | 4/1997 | Lee |
| 5,633,506 A | 5/1997 | Blake |
| 5,661,308 A | 8/1997 | Benveniste et al. |
| 5,676,759 A | 10/1997 | Ye et al. |
| 5,685,916 A | 11/1997 | Ye et al. |
| 5,700,327 A | 12/1997 | Babacz et al. |
| 5,714,738 A | 2/1998 | Hauschulz et al. |
| 5,747,936 A | 5/1998 | Harrison et al. |
| 5,751,002 A | 5/1998 | Ogata et al. |
| 5,779,849 A | 7/1998 | Blalock |
| 5,780,863 A | 7/1998 | Benveniste et al. |
| 5,785,796 A | 7/1998 | Lee |
| 5,788,778 A | 8/1998 | Shang et al. |
| 5,824,375 A | 10/1998 | Gupta |
| 5,832,177 A | 11/1998 | Shinagawa et al. |
| 5,843,239 A | 12/1998 | Shrotriya |
| 5,882,416 A | 3/1999 | Van Buskirk et al. |
| 5,883,364 A | 3/1999 | Frei et al. |
| 5,883,391 A | 3/1999 | Adibi et al. |
| 5,886,355 A | 3/1999 | Bright et al. |
| 5,932,882 A | 8/1999 | England et al. |
| 5,940,724 A | 8/1999 | Warren |
| 5,993,766 A | 11/1999 | Tom et al. |
| 6,013,332 A | 1/2000 | Goto et al. |
| 6,060,034 A | 5/2000 | Tsukamoto |
| 6,068,729 A | 5/2000 | Shrotriya |
| 6,093,625 A | 7/2000 | Wagner et al. |
| 6,094,012 A | 7/2000 | Leung et al. |
| 6,107,634 A | 8/2000 | Horsky |
| 6,130,436 A | 10/2000 | Renau et al. |
| 6,135,128 A | 10/2000 | Graf et al. |
| 6,143,084 A | 11/2000 | Li et al. |
| 6,150,628 A | 11/2000 | Smith et al. |
| 6,160,262 A | 12/2000 | Aoki et al. |
| 6,178,952 B1 | 1/2001 | Lammerts et al. |
| 6,184,532 B1 | 2/2001 | Dudnikov et al. |
| 6,221,169 B1 | 4/2001 | Bernstein et al. |
| 6,242,750 B1 | 6/2001 | Takahashi et al. |
| 6,253,783 B1 | 7/2001 | Carlsen et al. |
| 6,259,105 B1 | 7/2001 | Eddy et al. |
| 6,271,529 B1 | 8/2001 | Farley et al. |
| 6,288,403 B1 | 9/2001 | Horsky et al. |
| 6,313,475 B1 | 11/2001 | Renau et al. |
| 6,335,534 B1 | 1/2002 | Suguro et al. |
| 6,338,312 B2 | 1/2002 | Hayes et al. |
| 6,355,933 B1 | 3/2002 | Tripsas et al. |
| 6,423,976 B1 | 7/2002 | Glavish et al. |
| 6,441,382 B1 | 8/2002 | Huang |
| 6,449,521 B1 | 9/2002 | Gupta |
| 6,452,198 B1 | 9/2002 | Mani et al. |
| 6,452,338 B1 | 9/2002 | Horsky |
| 6,464,891 B1 | 10/2002 | Druz et al. |
| 6,479,828 B2 | 11/2002 | Perel |
| 6,486,431 B1 | 11/2002 | Smith et al. |
| 6,489,622 B1 | 12/2002 | Chen et al. |
| 6,498,348 B2 | 12/2002 | Aitken |
| 6,528,804 B1 | 3/2003 | Sullivan et al. |
| 6,545,419 B2 | 4/2003 | Vella |
| 6,559,462 B1 | 5/2003 | Carpenter et al. |
| 6,614,033 B2 | 9/2003 | Suguro et al. |
| 6,617,593 B2 | 9/2003 | Lien |
| 6,620,256 B1 | 9/2003 | Arno et al. |
| 6,639,227 B1 | 10/2003 | Glavish et al. |
| 6,653,643 B2 | 11/2003 | Saadatmand et al. |
| 6,664,547 B2 | 12/2003 | Benveniste |
| 6,670,623 B2 | 12/2003 | Vella |
| 6,670,624 B1 | 12/2003 | Adams et al. |
| 6,686,595 B2 | 2/2004 | Horsky |
| 6,686,601 B2 | 2/2004 | Murrell et al. |
| 6,703,628 B2 | 3/2004 | Ye et al. |
| 6,710,358 B1 | 3/2004 | Chen et al. |
| 6,712,084 B2 | 3/2004 | Shajii et al. |
| 6,740,586 B1 | 5/2004 | Wang et al. |
| 6,770,888 B1 | 8/2004 | Benveniste et al. |
| 6,772,776 B2 | 8/2004 | Klebanoff et al. |
| 6,777,696 B1 | 8/2004 | Rathmell et al. |
| 6,818,909 B2 | 11/2004 | Murrell et al. |
| 6,830,631 B2 | 12/2004 | Nenyei et al. |
| 6,835,930 B2 | 12/2004 | Benveniste et al. |
| 6,841,141 B2 | 1/2005 | Arno et al. |
| 6,852,242 B2 | 2/2005 | Sun et al. |
| 6,885,014 B2 | 4/2005 | Benveniste |
| 6,885,812 B2 | 4/2005 | Groom |
| 6,909,102 B1 | 6/2005 | Buccos |
| 6,909,839 B2 | 6/2005 | Wang et al. |
| 6,921,062 B2 | 7/2005 | Gregg et al. |
| 6,946,667 B2 | 9/2005 | Chen et al. |
| 6,956,225 B1 | 10/2005 | Benveniste |
| 6,958,481 B2 | 10/2005 | Horsky et al. |
| 6,992,311 B1 | 1/2006 | Ring et al. |
| 2003/0030010 A1 | 2/2003 | Perel et al. |
| 2003/0111014 A1 | 6/2003 | Donatucci et al. |
| 2004/0000647 A1 | 1/2004 | Horsky |
| 2004/0002202 A1 | 1/2004 | Horsky et al. |
| 2004/0077511 A1 | 4/2004 | Barnes et al. |
| 2004/0175160 A1 | 9/2004 | Groom |
| 2005/0169828 A1 | 8/2005 | Spielvogel et al. |
| 2005/0202657 A1 | 9/2005 | Borland et al. |
| 2005/0258380 A1 | 11/2005 | White et al. |
| 2005/0260354 A1 | 11/2005 | Singh et al. |
| 2005/0277246 A1 | 12/2005 | Kirkpatrick et al. |
| 2005/0279381 A1 | 12/2005 | Masuda et al. |
| 2006/0017010 A1 | 1/2006 | Vanderberg et al. |
| 2006/0027249 A1* | 2/2006 | Johnson et al. ............ 134/1.1 |
| 2006/0088666 A1 | 4/2006 | Kobrin et al. |
| 2006/0097645 A1 | 5/2006 | Horsky |
| 2006/0237663 A1 | 10/2006 | Balogh |

| | | | |
|---|---|---|---|
| 2006/0272775 | A1 | 12/2006 | Horsky et al. |
| 2006/0272776 | A1 | 12/2006 | Horsky et al. |
| 2007/0085021 | A1 | 4/2007 | Cobb et al. |
| 2007/0108395 | A1 | 5/2007 | Horsky et al. |
| 2007/0119546 | A1 | 5/2007 | Collins et al. |
| 2007/0137671 | A1 | 6/2007 | DiVergilio et al. |
| 2007/0170372 | A1 | 7/2007 | Horsky |
| 2007/0210260 | A1 | 9/2007 | Horsky et al. |
| 2007/0241689 | A1 | 10/2007 | Horsky et al. |
| 2008/0042580 | A1 | 2/2008 | Horsky |
| 2008/0047607 | A1 | 2/2008 | Horsky et al. |
| 2008/0121811 | A1 | 5/2008 | Horsky et al. |
| 2008/0223409 | A1 | 9/2008 | Horsky et al. |

FOREIGN PATENT DOCUMENTS

| | | |
|---|---|---|
| EP | 0474108 | 3/1992 |
| EP | 0555546 | 8/1993 |
| EP | 0648861 | 4/1995 |
| EP | 0697467 | 2/1996 |
| EP | 0762469 | 3/1997 |
| EP | 0954008 | 11/1999 |
| EP | 1061550 | 12/2000 |
| JP | 55-145338 | 11/1980 |
| JP | 56-026539 | 3/1981 |
| JP | 56-166935 | 12/1981 |
| JP | 61-135037 | 6/1986 |
| JP | 02-155147 | 6/1990 |
| JP | 06-084837 | 3/1994 |
| JP | 2003023051 | 1/2003 |
| WO | WO 96/15545 | 5/1996 |
| WO | WO 2004/003973 | 1/2004 |
| WO | WO 2005/059942 A2 | 6/2005 |

OTHER PUBLICATIONS

EPO Search Report EP 92 12 1322, Apr. 26, 1993.
EPO Search Report EP 91 11 4432, Dec. 23, 1991.
EPO Search Report EP 94 30 7356, Jan. 24, 1995.
Int'l Search Report, PCT/US95/14614, Apr. 19, 1996.
E.J. Collart et al. "Co-Implantation with Conventional Spike Anneal Solutions for 45 nm Ultra-Shallow Junction Formation", Proceedings of the Eight International Workshop on: Fabrication, Characterization and Modeling Of Ultra-Shallow Doping Profiles in Semiconductors, Jun. 2005, p. 327.
S Rizk et al. "Modeling the Suppression Boron Diffusion in Si/SiGe Due to Carbon Incorporation", ibid, p. 315.
L. S. Robertson et al., "The Effect of Impurities and Activation of Ion Implanted boron in Silicon", Mat. Res. Soc. Symp. vol. 610, pp. B5.8.1-B5.8.6 (2000).
Mare E. Law et al., "Influence of Carbon on the diffusion of Interstitials and Boron in Silicon", ibid, pp. B7.4.1-B7.4.5.
P. A. Stolk et al., "Understanding and Controlling Transient Enhanced Dopant Diffusion in Silicon", Mat. Res. Soc. Symp. Proc. vol. 354, pp. 307-318 (1995).
M. Ueda et al., "High Dose Nitrogen and Carbon Shallow Implantation in Si by Plasma Immersion Ion Implantation", Nuclear Instruments and Methods in Physics Research B 175-177 (2001) pp. 715-720.
Jorg K. N. Lindner et al., "Ion Beam Synthesis of Buried SiC Layers in Silicon: Basic Physical Processes", Nuclear Instruments and Methods Research B 178 (2001) pp. 44-54.
K. N. Lindner et al., "Mechanisms of SiC Formation in the Ion Beam Synthesis of 3 C—SiC Layers in Silicon", Materials Science Forum vols. 264-268 (1998) pp. 215-218.
Kah-Wee An et al., "Thin body Silicon-on-insulator N-MOSFET with Silicon-Carbon Source/Drain Regions for Performance Enhancement", IEDM Workshop, Washington, D.C., Dec. 2005.
Masahiro et al., "B—SiC Formation by Low-Energy Ion-Doping Technique", Japanese Journal of Applied Physics vol. 29, No. 8, Aug. 1990, pp. L 1493-L 1496.

* cited by examiner

METHOD FOR EXTENDING EQUIPMENT UPTIME IN ION IMPLANTATION

CROSS REFERENCE TO RELATED APPLICATIONS

This application claims priority to and the benefit of U.S. Provisional Patent Application No. 60/974,176, filed on Sep. 21, 2007.

BACKGROUND OF THE INVENTION

1. Field of the Invention

The present invention relates to a method of semiconductor manufacturing and more particularly to a process for removing residual, non-volatile implant material from the internal surfaces of an ion implanter system.

2. Description of the Prior Art

The Ion Implantation Process

The fabrication of semiconductor devices involves, in part, the formation of transistor structures within a silicon substrate by ion implantation. As disclosed by Sferlazzo et. al. in U.S. Pat. No. 5,497,006, ion implantation equipment includes an ion source which creates a stream of ions containing a desired dopant species, a beam line which extracts and accelerates the ions from the ion source by means of an extraction electrode, and forms and focuses the ion stream into an ion beam having a well-defined energy or velocity, an ion filtration system which selects the ion of interest, since there may be different species of ions present within the ion beam, and a process chamber which houses the silicon substrate upon which the ion beam impinges; the ion beam penetrating a well-defined distance into the substrate. Transistor structures are created by passing the ion beam through a mask formed directly on the substrate surface, the mask being configured so that only discrete portions of the substrate are exposed to the ion beam. Where dopant ions penetrate into the silicon substrate, the substrate's electrical characteristics are locally modified, creating source, drain and gate structures by the introduction of electrical carriers: such as, holes by p-type dopants, such as boron or indium, and electrons by n-type dopants, such as phosphorus or arsenic, for example.

A recent development in semiconductor processing is the incorporation of mechanical stress to enhance transistor performance. This stress is generated by including atoms of elements other than silicon into a lattice structure. The successful process to date has been the incorporation of Ge atoms into the source and drain regions of a PMOS transistor. Inclusion of Ge atoms into a silicon substrate forms a SiGe alloy, which has a compatible lattice structure with the Si lattice. However, the Ge atoms are larger than the Si atoms, resulting in a larger lattice constant for the SiGe alloy, which can be controlled by the amount of Ge included. By forming this alloy material in the source and drain region of a PMOS transistor, the larger lattice therein places the channel region under compressive strain, which enhances the hole mobility and increases the performance of the PMOS transistor. The inclusion of Ge atoms only works for PMOS transistors because compressive strain is detrimental to the electron mobility and degrades the performance of an NMOS transistor.

Traditionally, Bernas-type ion sources have been used in ion implantation equipment. Such ion sources are known to break down dopant-bearing feed gases, such as $BF_3$, $AsH_3$ or $PH_3$, for example, into their atomic or monomer constituents, producing the following ions in copious amounts: $B^+$, $As^+$ and $P^+$. Bernas-type ion sources are known as hot plasma or arc discharge sources and typically incorporate an electron emitter, either a naked filament cathode or an indirectly-heated cathode. This type of source generates a plasma that is confined by a magnetic field.

Recently, cluster implantation ion sources have been introduced into the equipment market. These ion sources are unlike the Bernas-style sources in that they have been designed to produce "clusters", or conglomerates of dopant atoms in molecular form, e.g., ions of the form $As_nP_n^+$, or $B_nH_m^+$, where n and m are integers, and $2 \leq n \leq 18$. Such ionized clusters can be implanted much closer to the surface of the silicon substrate and at higher doses relative to their monomer (n=1) counterparts, and are therefore of great interest for forming ultra-shallow p-n transistor junctions, for example in transistor devices of the 65 nm, 45 nm, or 32 nm generations. These cluster sources preserve the parent molecules of the feed gases and vapors introduced into the ion source. The most successful of these have used electron-impact ionization, and do not produce dense plasmas, but rather generate low ion densities at least 100 times smaller than produced by conventional Bernas sources. For example, the method of cluster implantation and cluster ion sources has been described by Horsky et al. in U.S. Pat. Nos. 6,452,338 and 6,686,595, hereby incorporated by reference. The use of $B_{18}H_{22}$ as an implant material for ion implantation of $B_{18}H_x^+$ in making PMOS devices is disclosed in Horsky et al. in pending U.S. patent application Ser. No. 10/251,491, published as U.S. Patent Application Publication No. US 2004/0002202 A1, hereby incorporated by reference.

As device technology continues to scale in all dimensions, it becomes increasingly difficult to form the p-type Ultra Shallow Junctions, or USJ, necessary for the proper formation of the PMOS transistor. The most challenging feature of the PMOS transistor is the Source/Drain Extension, or SDE, which must be the shallowest junction in the transistor to be effective. For 65 nm node technology (as defined in the International Technology Roadmap for Semiconductors, or ITRS), it is required that the PMOS SDE be around 15-25 nm deep, while 45 nm technology will require PMOS SDE junction depths of 8-20 nm.

There are two principal means of controlling the junction depth: (1) controlling the initial placement of the boron dopants, and (2) controlling their subsequent movement during activation. The dopants move whenever they experience high temperature, such as during the implant anneal and activation process. The initial placement of the dopant is determined by the implant energy of the dopant ion. Both of these means have historically been used to scale the vertical dimension of the PMOS SDE as the technology scales to smaller gate lengths. The principal means of reducing PMOS SDE junction depth in recent generations has been by reducing the annealing time during the activation step, which reduces dopant diffusion and thereby results in the formation of a shallower junction. The implant energy has also been reduced to make the initial dopant placement shallower, i.e., closer to the silicon surface, but since implanter beam currents are reduced at lower beam energy, and substantially so at the sub-keV boron energies required for boron implantation for sub-90 nm feature sizes, this significantly reduces the productivity (wafer throughput) of the implant tool, and so is not an attractive means to reduce junction depth.

Diffusion is a natural result of the need to activate the implanted boron, that is, the implanted wafer must be annealed at high temperature for the implanted boron to become electrically active in the silicon. Whenever silicon containing boron is exposed to high temperatures, the boron will move, or diffuse, from regions of high concentration to regions of lower concentration. This boron movement challenges the formation of very shallow junctions. The major trend in anneal development has been the reduction of annealing time, which manages the net diffusion. Modern wafer processing incorporates a "spike" anneal which quickly ramps to a high temperature (1000-1100 C) and down again. This technique has been very effective in reducing diffusion and providing a production worthy process solution. However, for sub-90 nm node technology even less boron diffusion is required; the ramp rate limit of spike annealing systems (up to 150 C/sec) has been reached. The next step in reducing thermal budget this trend will likely use the "millisecond" technologies of either "flash annealing" or laser thermal processing. Both of these technologies are still immature and face significant challenges in providing production worthy solutions. Also, as thermal budgets are reduced to very small values by these ultra-fast annealing approaches, the activation process itself is affected. For example, higher sheet resistances are achieved and the spatial non-uniformity of the sheet resistance, or Rs, is higher than achieved by spike anneals.

One alternative to the continued reduction of annealing time is the introduction of other impurities which are known to hinder the diffusion of boron, potentially resulting in a shallower junction at the same thermal budget. For example, it is well known that F, historically introduced during a $BF_2^+$ implantation step, can reduce boron diffusion. Thus, junctions formed by a $BF_2^+$ implant are usually shallower than the equivalent $B^+$ implant when the same annealing process is used. However, since the F is introduced in the same implantation process as the boron, i.e., as part of the molecular species $BF_3$, the as-implanted F depth profile that results from $BF_2^+$ implant is not optimized for the reduction of B diffusion; this makes $BF_2^+$ implantation less attractive as junction depths are reduced further.

Another alternative is the introduction of carbon, which is also known to inhibit diffusion. See for example, E. J. Collart, S. B. Felch, H. Graoui, D. Kirkwood, B. J. Pawlak, P. P. Absil, S. Sevri, T. Janssens and W. Vandervorst, "Co-Implantation with Conventional Spike Anneal Solutions for 45 nm Ultra-Shallow Junction Formation", Proceedings of the Eight International Workshop on: Fabrication, Characterization and Modelling of Ultra-Shallow Doping Profiles in Semiconductors, June 2005, p. 327; N. Cowern, B. Colombeau, J. Graoui, and M. Foad, "Computational Modeling of Co-iimplanted Carbon for 65 nm Node USJ Formation, ibid, p. 300.; S. Rizk, Y. M. Haddara and A. Sibaja-Hernandez, "Modeling the Suppression of Boron Diffusion in Si/SiGe Due to Carbon Incorporation, ibid, p. 315; L. S. Robertson, R. Brindos, and K. S. Jones, "The effect of impurities and activation of ion implanted boron in silicon", Mat. Res. Soc. Symp. Vol. 610, pp. B5.8.1-B5.8.6 (2000); Mark E. Law, Michelle D. Griglione, and Misty Northridge, "Influence of Carbon on the Diffusion of Interstitials and Boron in Silicon", ibid, pp. B7.4.1-B7.4.5; E. J. H. Collart et al., "Co-implantation with conventional spike anneal solutions for 45 nm ultra-shallow junction formation", Internal Conference on Ultra-Shallow Junctions, USJ2005, June 5-8, Florida, USA (2005); P. A. Stolk, H.-J. Gossmann, D. J. Eaglesham, D. J. Jacobson, H. S. Luftman, and J. M. Poate, "Understanding and controlling transient enhanced dopant diffusion in silicon", Mat. Res. Soc. Symp. Proc. Vol. 354, pp. 307-318 (1995); M. Ueda, H. Reuther, R. Gunzel, A. F. Beloto, E. Abramof, and L. A. Berni, "High dose nitrogen and carbon shallow implantation in Si by plasma immersion ion implantation", Nuclear Instruments and Methods in Physics Research B 175-177 (2001) pp. 715-720; Jorg K. N. Lindner, "Ion beam synthesis of buried SiC layers in silicon: Basic physical processes", Nuclear Instruments and Methods in Physics Research B 178 (2001) pp. 44-54; J. K. N. Lindner, W. Reiber and B. Stritzker, "Mechanisms of SiC Formation in the Ion Beam Synthesis of 3 C—SiC Layers in Silicon", Materials Science Forum Vols. 264-268 (1998) pp. 215-218; M. Ueda et al., "High dose nitrogen and carbon shallow implantation in Si by plasma immersion ion implantation", Nuclear Instruments and Methods in Physics Research B 175-177 (2001) pp. 715-720; Kah-Wee Ang et al., "Thin body silicon-on-insulator N-MOSFET with silicon-carbon source/drain regions for performance enhancement", IEDM Workshop, Washington, D.C., December, 2005; Masahiro Deguchi, Akihisa Yoshida, and Masatoshi Kitagawa, "B—SiC formation by low-energy ion-doping technique", Japanese Journal of Applied Physics Vol. 29, No. 8, August, 1990, pp. L 1493-L 1496, all hereby incorporated by reference.

Carbon implantation has been available essentially since the introduction of commercial ion implantation systems for semiconductor manufacturing, which started in the mid-1970s. The available implantation technology performs the implant one atom at a time, regardless of the feed material used. This occurs because conventional ion source technology uses an intense plasma to ionize the material, and the plasma breaks apart molecules into their component atoms. For most applications, this works well.

Carbon implantation has been used as a method of gettering defects or contaminants for some time. See, for example, the Stolk et al and the Ueda et al references above. Since defects have been shown to drive transient enhanced diffusion of B and P in silicon, trapping interstitial defects has been seen as a candidate method for limiting diffusion. Conventional processes use either $CO_2$ or CO gas source to a conventional plasma ion source. Beams of $C^+$ are generated and implantation can be performed with a commercial ion implantation system. The use of $CO_2$ or CO gas degrades the service lifetime of conventional plasma sources due to oxidation effects and also carbon tracking of insulators found in the sources.

The issue with the conventional technology is that the implantation by single atoms becomes very inefficient when the energy of the ions must be low (e.g., 1 or 2 keV) in order to provide for shallow implant. Conventional systems cannot produce high currents at low extraction energy and so the implantation process has very low productivity. By implanting carbon-containing molecules instead of individual atoms, the physics of low energy implantation are significantly modified. The extraction energy is much higher, since the molecule needs the process energy for each carbon atom, which makes the extraction system able to operate efficiently and generate high beam currents.

The use of ionized clusters of carbon and/or boron requires a novel ion source, for example, as disclosed in U.S. Pat. No. 6,686,595, hereby incorporated by reference. For example, a vapor of a hydrocarbon is introduced into the ion source. The ion source ionizes the molecule without dissociation. The extraction system then extracts an ion beam of the ionized carbon molecule which is then transported down the beam line of a conventional ion implanter to impact the silicon wafer.

However, the utilization of large molecular species, such as carbon, has introduced new challenges in removing residual matter from within the implantation device. As such, previous cleaning methodologies have proven to be unsatisfactory in removing residual materials to acceptable levels. Deposits of these larger "cluster" molecules do not react at sufficient rates under the previous conditions.

Cleaning techniques for semiconductor processing equipment and implanter systems are known, such as the techniques found in U.S. Pat. Nos. 5,129,958; 5,354,698; 5,554,854; and 5,940,724. Cleaning processes of some usefulness for residual boron hydride materials have been developed. These cleaning techniques are ineffective when applied to residual carbon materials in ion implanter systems.

SUMMARY OF THE INVENTION

The invention features in-situ cleaning process for an ion source and associated extraction electrodes and similar components of the ion-beam producing system, which chemically removes carbon deposits, increasing service lifetime and performance, without the need to disassemble the system.

The invention features the increased reactivity of molecular implant residue with reactive gases. In particular, an aspect of the invention is directed to an activating, catalytic, or reaction promoting species added to the reactive species to effectively convert the non-volatile molecular residue into a volatile species which can be removed by conventional means.

An aspect of the invention is directed to increased rates of reaction to shorten cycle times.

Another aspect of the invention is directed to the conversion of non-volatile molecular implant residue to gas phase species for removal of the contaminants.

A particular aspect of the invention is directed to cleaning of the ion system of carbon residue contaminants by reacting the carbon materials with halogens, oxygen or hydrogen in the presence of a reaction promoting species, such as a Lewis Acid, which is an electron density acceptor. Forms of Lewis Acids are aluminum halides and boron trifluoride, $BF_3$.

DESCRIPTION OF THE DRAWINGS

The sole drawing is a flow sheet illustrating the improved cleaning process of the invention.

DETAILED DESCRIPTION

Figure 1:
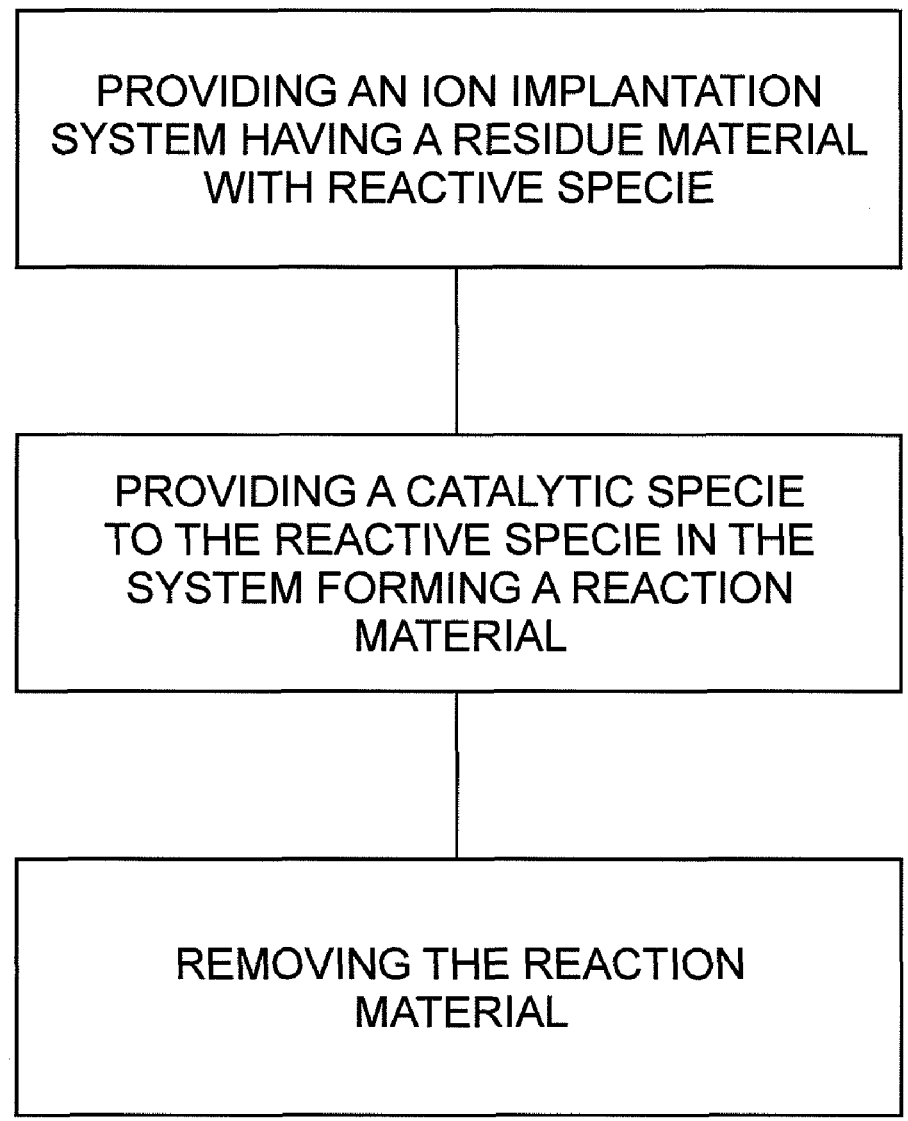

The invention comprises an improvement in cleaning of carbon residues from semiconductor wafer processing equipment, such as, an ion implantation system, wherein the carbon residue is contacted with one or more reaction species in the presence of a reaction promoting or catalytic species. The standard method used for $B_{18}$ cleaning is has essentially no affect on carbon cluster residues. That is flourine F* components generated in the plasma from $NF_3$ is not known to remove the residue build up. When $B_{18}$ residue is deposited on top of or underneath carbon cluster residues and a standard cleaning recipe run, a reasonable clean was achieved. The only difference being the addition of boron hydride to the system. From an RGA analysis of the $B_{18}$ clean, the boron residues are removed from the system as $BF_3$. This byproduct of the boron clean is a so called "Lewis acid" (electron density acceptor) that is known to catalytically activate aromatic pi electron system, such as those found in CC-C14 (bibenzyl) and CC-C16 (fluoranthene). This activation leaves the aromatic system susceptible to attack/reaction and may lead to the break down of the residues. Also, a further byproduct of the boron residue clean is HF. It is also well known that HF in the presence of $BF_3$ forms a superacid system. That is, an acid that is stronger than concentrated sulfuric acid. The $BF_3$/HF system can protonate substrates that are very resistant to such a reaction. If this happens, adding a proton (H+) to an aromatic system will disrupt the aromaticity of the compound, break it down and/or render it susceptible to further attack from F*. The breakdown of the residues to smaller and perhaps more volatile components should allow them to removed from the system in a more facile manner.

U.S. Pat. No. 6,452,338 and U.S. application Ser. No. 10/582,392, filed on Mar. 14, 2007, hereby incorporated by reference, discloses an ion system capable of implanting large molecular ions. International Patent Application Publication No. WO 2005/059942 A2, published on Jun. 30, 2005, hereby incorporated by reference, describes in detail an in situ chemical cleaning system for semiconductors (also referred to herein as a semiconductor cleaning system) suitable for use with the present invention. The principles of the invention are also applicable with other semiconductor cleaning systems.

According to the present invention, a ion system, such as ion system mentioned above, may be used to implant carbon ions into a semiconductor wafer. This process of ion implantation results in a residue of carbon on the various components, e.g., walls, optics, and electrode, of the system. As described in publicly available literature relating to various cleaning techniques, the ion system may be taken apart for cleaning of the components or the system may be cleaned in situ by the introduction of a cleaning agent through appropriate containers, valves and associated equipment.

In the present invention, a reactive specie; such as reactive halogen gasses, such as fluorine, chlorine, bromine or iodine gas ; or oxygen or hydrogen gas may be introduced into the system to remove the carbon residue, which will be of the form $AB_xH_y$, where x and y are integers $\geq 0$. In addition, an activating, catalytic or reaction promoting species, hereinafter the "catalytic" specie, may be mixed with or introduced with the reactive specie such that carbon residue may be readily removed from the system. Hydrogen fluoride gas may also be used as a reactive specie.

In one embodiment of the invention, the catalytic specie, preferably in the gas phase is added to the reactive specie to promote the conversion of the non-volatile molecular residue into a volatile species which is then removed by conventional means, such as pumping. In order to remove the non-volatile molecular residue particularly carbon residue, the reactive species intended to remove the carbon may be induced to increase or actively promote the intended reaction by the introduction of a catalytic specie. In particular, the difficulty in removing or the reaction the carbon residue with the reactive specie may be due to electron bonding of the carbon residue that interferes with the proposed reaction with the reactive specie. In this event, the introduction of the catalytic specie affects that carbon residue electron bond, such that the reactive specie may effectively react with the carbon residue and convert the non-volatile residue into a volatile specie for removal.

The catalytic specie may be introduced in situ with the reactive gas specie or through an independent inlet. The catalytic specie may be mixed with the reactive specie to form a mixed specie and then introducing the mixed specie into the semiconductor cleaning system.

In accordance with the present invention, $BF_3$ may be used as the catalytic specie for promoting the reaction of the residual carbon materials with the reactive specie. For example:

$BF_3$ in combination with hydrogen, $H_2$, will result in a volatile specie of $C_xH_y$;

$BF_3$ in combination with oxygen, $O_2$, will result in a volatile specie of $CO_y$;

$BF_3$ in combination with a halogen, Z, will result in a volatile specie of $C_xZ_y$; and $BF_3$ in combination with hydrogen fluoride, HF, will result in a volatile specie of $C_xF_y$, any one of which may be readily removed from the system, thereby effectively cleaning the system in situ. Other catalytic species may be used to promote the reactive species to increase the rate of reaction, promote conversion of non-volatile molecular implant residue and to effectively remove molecular residue from a system in situ by any one of well known means.

In another embodiment of the invention, it has been determined that specific residues not readily or effectively cleaned by reaction with appropriate reactive species may be particularly targeted for cleaning by the introduction of a catalytic specie with the reactive cleaning specie to promote the intended cleaning.

Obviously many modifications and variations of the present invention are possible in light of the above teachings. Thus, it is to be understood that, within the scope of the appended claims, the invention may be practiced otherwise than is specifically described above.

We claim:

1. A method of cleaning a semiconductor system of a residue material with a semiconductor cleaning system, the method comprising:

providing a reactive specie and boron triflouride gas as a catalytic specie to the semiconductor cleaning system to promote the conversion of the residue material to a gas removing said gas.

2. A method of cleaning a semiconductor system of a residue material with a semiconductor cleaning system, the method comprising;

providing a reactive specie to the semiconductor cleaning system; providing a catalytic specie to the semiconductor cleaning system, wherein the catalytic specie is boron trifluoride gas; mixing a catalytic specie with the reactive specie; providing the mixed specie to the semiconductor cleaning system to increase the rate of reaction with the residue material to form a removable material; and removing the removable material.

3. A method according to claim 1, wherein the reactive specie is a halogen gas.

4. A method according to claim 1, wherein the reactive specie is oxygen gas.

5. A method according to claim 1, wherein the reactive specie is hydrogen gas.

6. A method according to claim 1, wherein the reactive specie is hydrogen fluoride gas.

* * * * *